(12) United States Patent
Park et al.

(10) Patent No.: US 12,491,707 B2
(45) Date of Patent: Dec. 9, 2025

(54) ALIGNMENT DEVICE AND LAMINATION DEVICE INCLUDING THE SAME

(71) Applicant: Samsung Display Co., LTD., Yongin-si (KR)

(72) Inventors: Taeyoung Park, Yongin-si (KR); Sukju Kang, Yongin-si (KR); Tetsuya Okamoto, Yongin-si (KR); Byung Moo Kim, Yongin-si (KR); Sang Cheol Kim, Yongin-si (KR); Myung-Hun Oh, Yongin-si (KR); Donggul Lee, Yongin-si (KR); Jun-Hee Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 96 days.

(21) Appl. No.: 18/226,458

(22) Filed: Jul. 26, 2023

(65) Prior Publication Data

US 2024/0181766 A1    Jun. 6, 2024

(30) Foreign Application Priority Data

Dec. 6, 2022    (KR) .................. 10-2022-0168648

(51) Int. Cl.
   *B32B 41/00*    (2006.01)
   *B32B 37/00*    (2006.01)
   *B32B 38/18*    (2006.01)

(52) U.S. Cl.
   CPC .......... *B32B 38/18* (2013.01); *B32B 37/0046* (2013.01)

(58) Field of Classification Search
   CPC . B32B 38/18; B32B 37/0046; B32B 38/1841; B32B 38/1833; B32B 2457/20; G02F 1/1303; B65G 49/063; B65G 49/067; H01L 21/67242; H01L 21/681; H10K 71/00
   USPC .................. 156/60, 64, 350, 351, 378, 379
   See application file for complete search history.

(56) References Cited

U.S. PATENT DOCUMENTS

2015/0370098 A1*  12/2015  Yamaguchi ....... G02F 1/133308
                                                   156/538

FOREIGN PATENT DOCUMENTS

| KR | 1020060076049 A | 7/2006 |
|----|----|----|
| KR | 1020110032673 A | 3/2011 |
| KR | 1020200078243 A | 7/2020 |
| KR | 102255064 B1 | 5/2021 |
| KR | 1020220096059 A | 7/2022 |

\* cited by examiner

*Primary Examiner* — Michael N Orlando
*Assistant Examiner* — Joshel Rivera
(74) *Attorney, Agent, or Firm* — CANTOR COLBURN LLP

(57) ABSTRACT

An alignment device includes: a first stage; a plurality of base plates disposed on the first stage and on which a material is placed; and a plurality of second stages disposed under the first stage, and connected to the plurality of base plates, respectively, and capable of aligning each of the plurality of base plates in X, Y, and ⊖ directions.

20 Claims, 15 Drawing Sheets

ALIGNMENT DEVICE AND LAMINATION DEVICE INCLUDING THE SAME

This application claims priority to Korean Patent Application No. 10-2022-0168648 filed on Dec. 6, 2022, and all the benefits accruing therefrom under 35 U.S.C. § 119, the content of which in its entirety is herein incorporated by reference.

BACKGROUND

1. Field

Embodiments relate to an alignment device. More particularly, Embodiments relate to an alignment device and a lamination device including the alignment device.

2. Description of the Related Art

A manufacturing process of a display device includes a variety of processes such as a process of bonding a window and a display panel, a process of bonding the window and a touch sensor panel, a process of bonding a polarizing film to the display panel, a process of forming a hole, a process of cutting the display panel, and the like.

Demand for an alignment device capable of reducing an alignment error due to a material or a process variation for enhancing yield in the manufacturing process of the display device is increasing.

SUMMARY

Embodiments provide an alignment device.

Embodiments provide a lamination device including the alignment device.

The alignment device according to an embodiment of the present disclosure includes: a first stage: a plurality of base plates disposed on the first stage and on which a material is placed; and a plurality of second stages disposed under the first stage, and connected to the plurality of base plates, respectively, and capable of aligning each of the plurality of base plates in X, Y, and ⊖ directions.

In an embodiment, the plurality of base plates may include: a first plate disposed on a center of the first stage, a second plate disposed on a first side of the first plate, and a third plate disposed on a second side of the first plate opposite to the first side.

In an embodiment, the plurality of second stages may include a first alignment stage connected to the first plate, a second alignment stage disposed on the first alignment stage and connected to the second plate, and a third alignment stage disposed on the first alignment stage and connected to the third plate.

In an embodiment, the alignment device may further include a first pitch control unit disposed between the first alignment stage and the second alignment stage and capable of horizontal movement, and a second pitch control unit disposed between the first alignment stage and the third alignment stage and capable of horizontal movement.

In an embodiment, the alignment device may further include a plurality of load distribution units disposed between the first stage and the plurality of base plates. Each of the plurality of load distribution units may include a guide rail, and a cross roller movable along the guide rail.

In an embodiment, the plurality of load distribution units may include a first load distribution unit and a second load distribution unit. The first load distribution unit may be disposed under the second plate. The second load distribution unit may be disposed under the third plate.

In an embodiment, each of the plurality of second stages may be a UVW stage.

In an embodiment, the alignment device may further include at least one jig disposed on the plurality of base plates.

In an embodiment, the material may be a display panel.

In an embodiment, the alignment device may further include a vision unit disposed on the plurality of base plates.

The lamination device according to another embodiment of the present disclosure includes an alignment device and a pressure unit. The alignment includes: a first stage: a plurality of base plates disposed on the first stage and on which a material is placed: and a plurality of second stages disposed under the first stage, and connected to the plurality of base plates, respectively, and capable of aligning each of the plurality of base plates in X, Y, and ⊖ directions. The pressure unit is disposed on the alignment device and on which a second material is placed.

In an embodiment, the plurality of base plates may include: a first plate disposed on a center of the first stage, a second plate disposed on a first side of the first plate, and a third plate disposed on a second side of the first plate opposite to the first side.

In an embodiment, the plurality of second stages may include a first alignment stage connected to the first plate, a second alignment stage disposed on the first alignment stage and connected to the second plate, and a third alignment stage disposed on the first alignment stage and connected to the third plate.

In an embodiment, the lamination device may further include a first pitch control unit disposed between the first alignment stage and the second alignment stage and capable of horizontal movement, and a second pitch control unit disposed between the first alignment stage and the third alignment stage and capable of horizontal movement.

In an embodiment, the lamination device may further include a plurality of load distribution units disposed between the first stage and the plurality of base plates. Each of the plurality of load distribution units may include a guide rail, and a cross roller movable along the guide rail.

In an embodiment, the plurality of load distribution units may include a first load distribution unit and a second load distribution unit. The first load distribution unit may be disposed under the second plate. The second load distribution unit may be disposed under the third plate.

In an embodiment, each of the plurality of second stages may be a UVW stage.

In an embodiment, the lamination device may further include at least one jig disposed on the plurality of base plates.

In an embodiment, the first material may be a display panel.

In an embodiment, the second material may be a cover glass.

The alignment device and the lamination device including the alignment device according to embodiments of the present disclosure may align a plurality of materials at once by including the plurality of base plates.

In addition, the alignment device and the lamination device may align each of the plurality of base plates by further including the plurality of second stages.

In addition, the alignment device and the lamination device may handle the plurality of materials having various sizes and gaps with one facility by further including a plurality of pitch control units.

In addition, the alignment device and the lamination device may distribute a load applied to the plurality of base plates when pressurized from above by further including the plurality of load distribution units.

DETAILED DESCRIPTION

Figure 1:
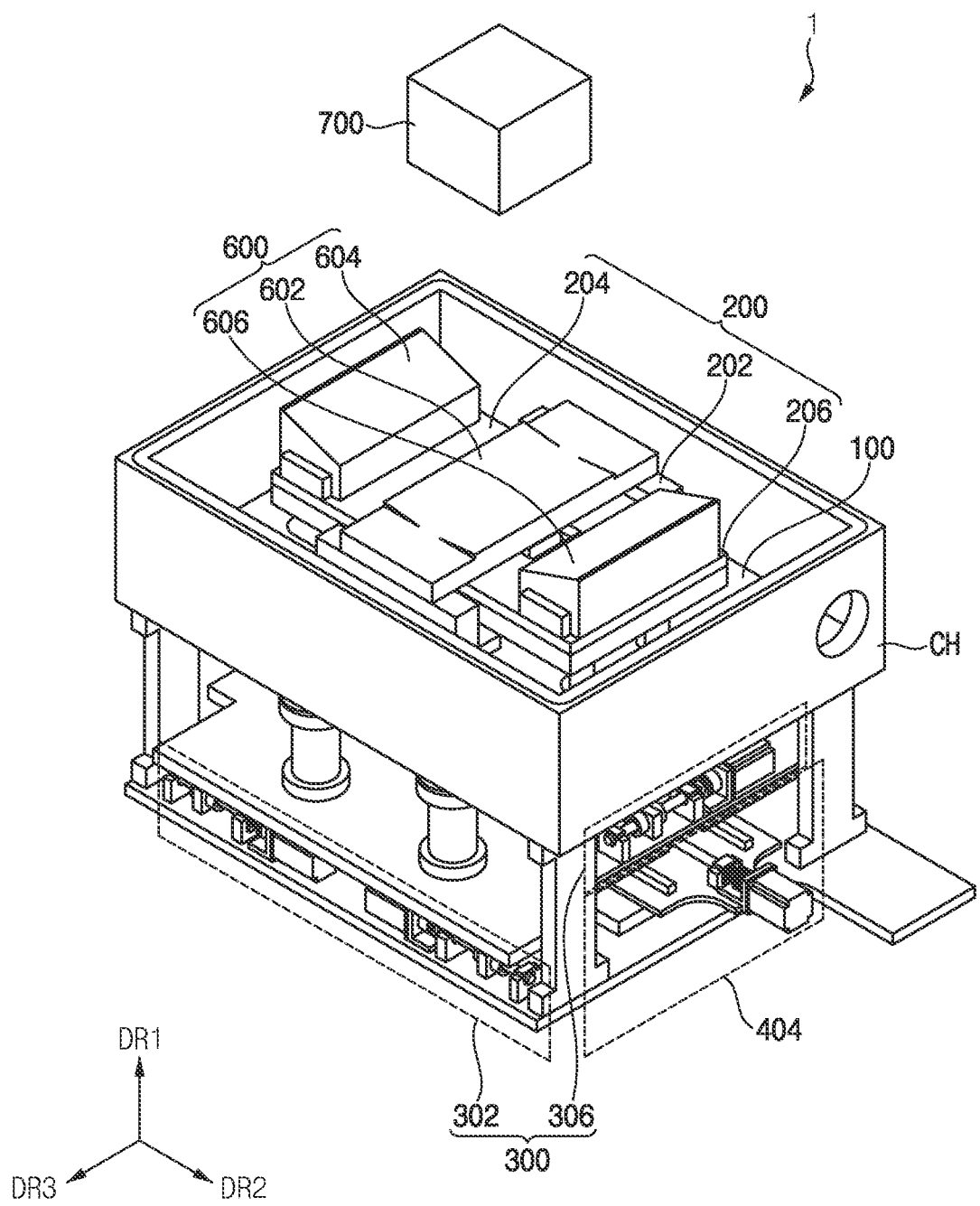
FIGS. 1, 2, 3, and 4 are views illustrating an alignment device according to an embodiment of the present disclosure.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, in unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, embodiments of the present invention will be described in more detail with reference to the accompanying drawings. The same reference numerals are used for the same components in the drawings, and redundant descriptions of the same components will be omitted.

Figure 2:
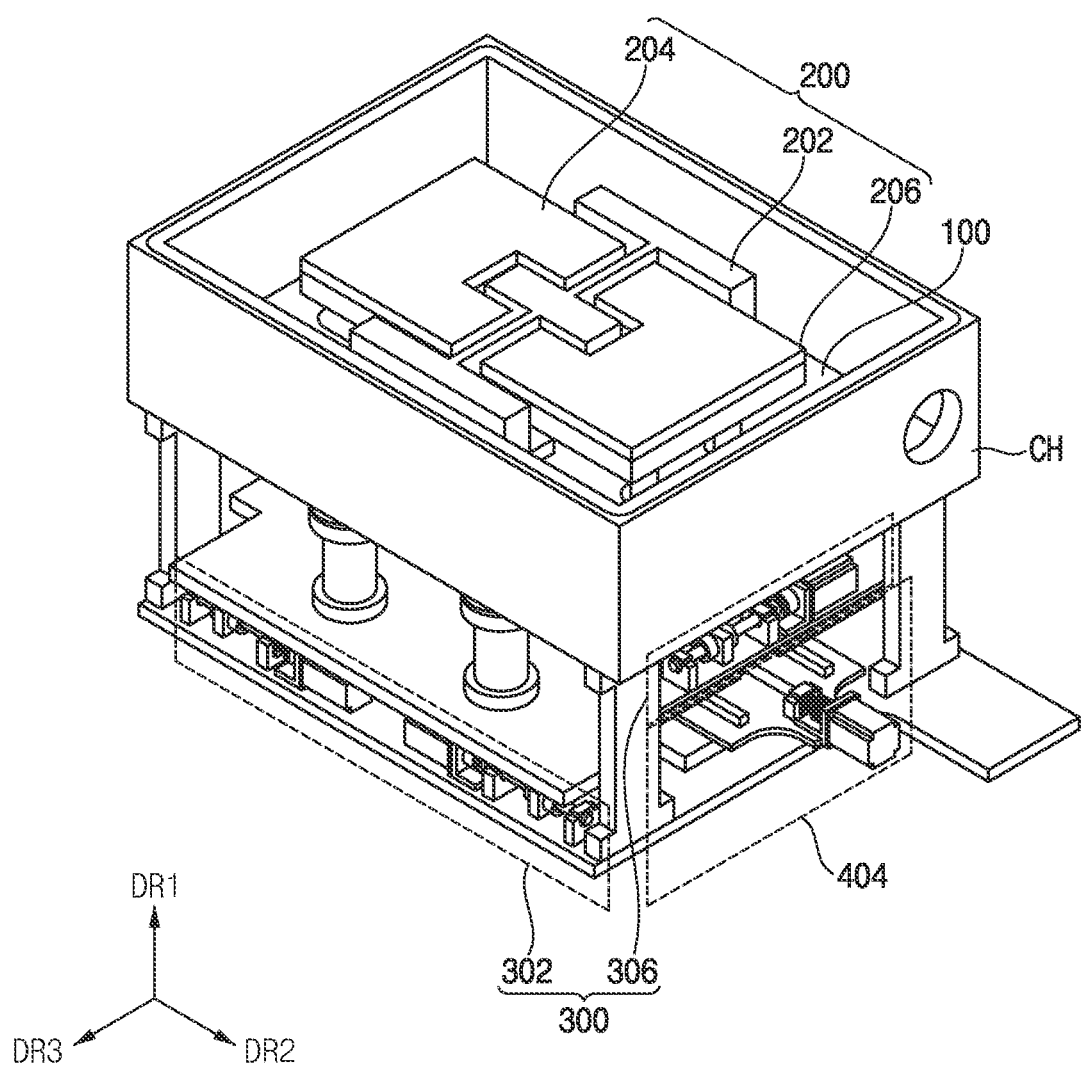
Figure 3:
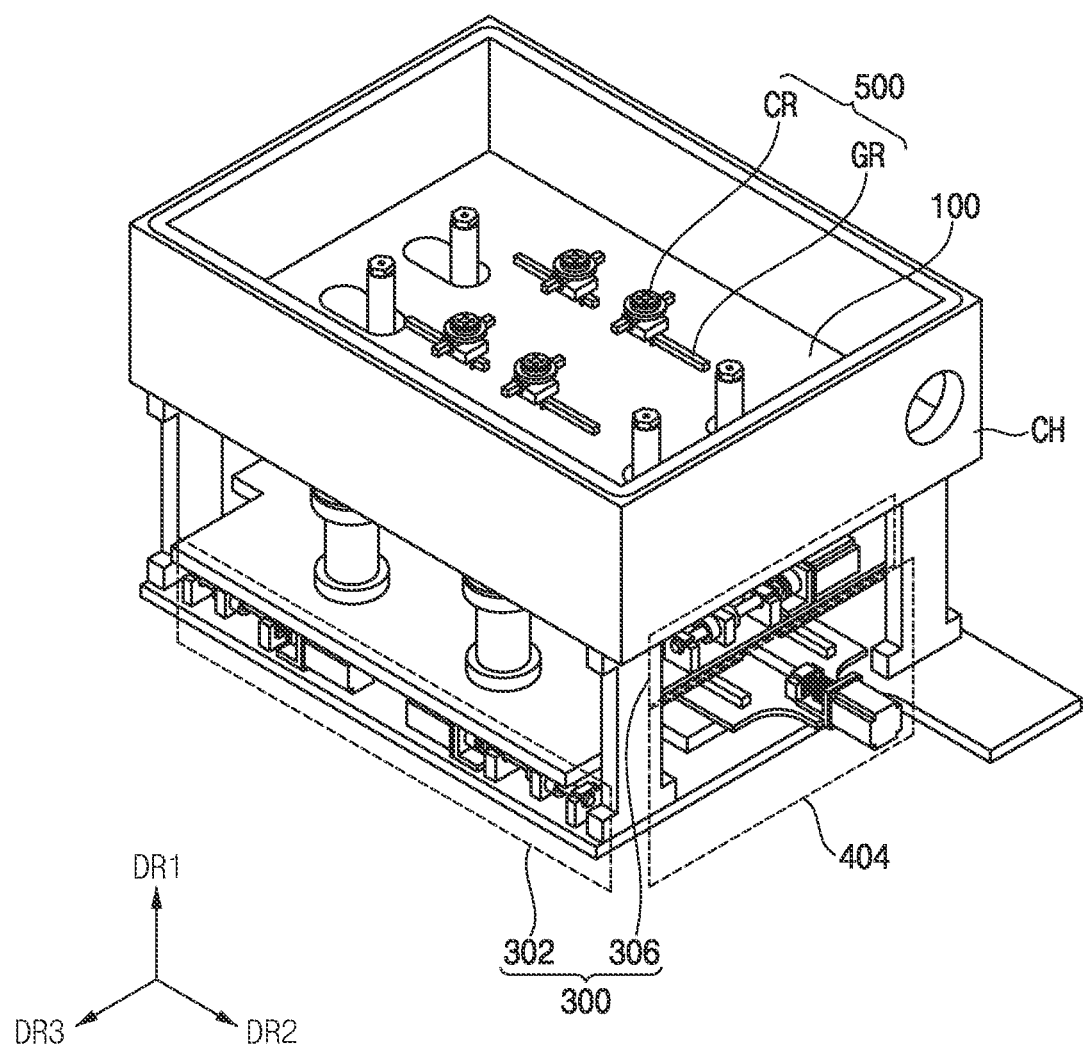
Figure 4:
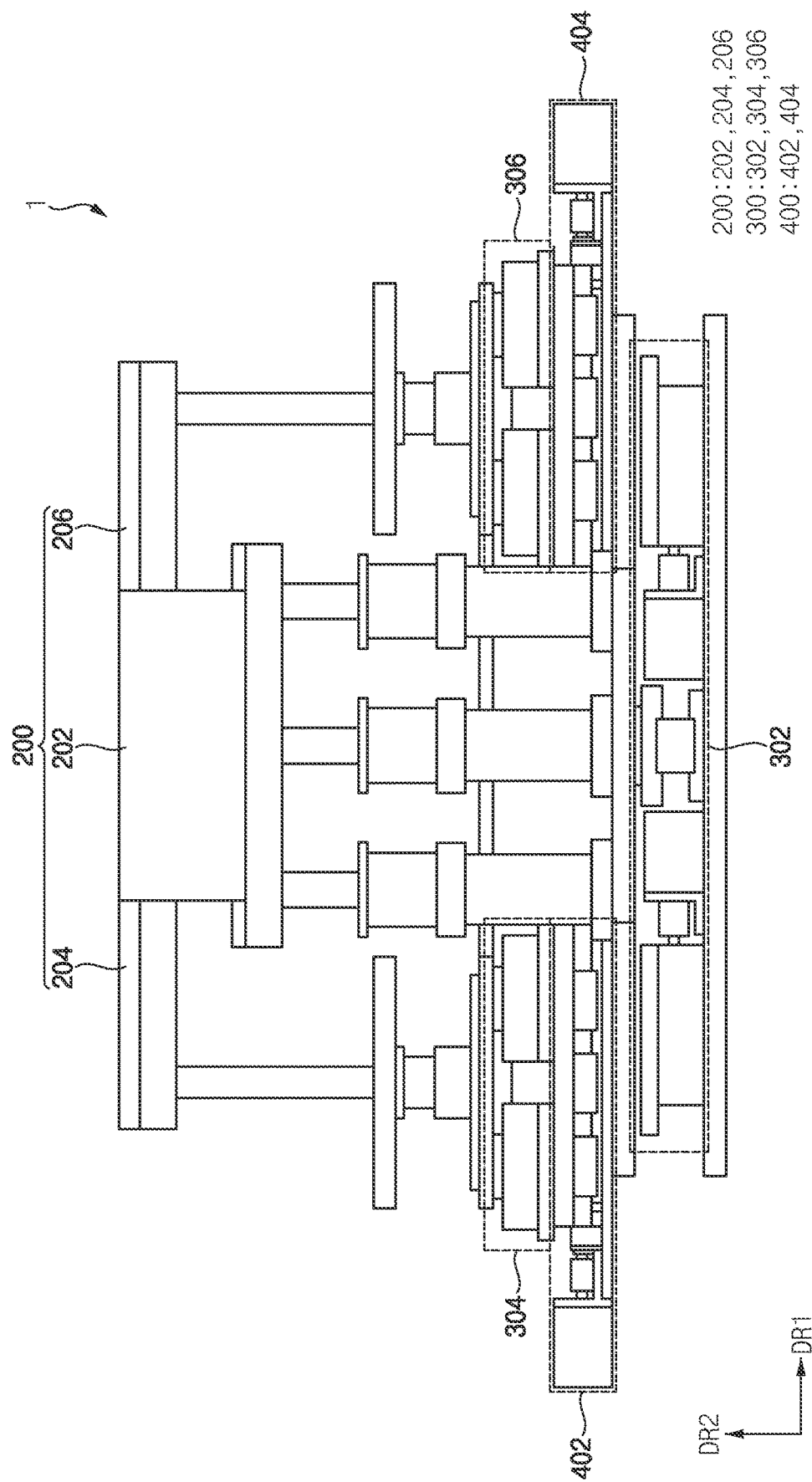

FIGS. 1, 2, 3, and 4 are views illustrating an alignment device according to an embodiment of the present disclosure. For example, FIG. 1 is a perspective view of the alignment device 1 according to an embodiment of the present disclosure. FIG. 2 is a perspective view in which at least one jig 600 and a vision unit 700 are omitted in the alignment device 1 of FIG. 1. FIG. 3 is a perspective view in which a plurality of base plates 200 are omitted in the alignment device 1 of FIG. 2. FIG. 4 is a front view in which a chamber CH is omitted in the alignment device 1 of FIG. 2.

Referring to FIGS. 1, 2, 3, and 4, the alignment device 1 according to an embodiment of the present disclosure may include the chamber CH, a first stage 100, the plurality of base plates 200, a plurality of second stages 300, a plurality of pitch control units 400, a plurality of load distribution units 500, the jig 600, and the vision unit 700.

The chamber CH may provide a space in which each of the first stage 100, the plurality of base plates 200, and the jig 600 may be placed. In an embodiment, for example, the chamber CH may have a rectangular shape with a hollow inside in a plan view. As used herein, the "plan view" is a view in a first direction DR1.

The first stage 100 may be disposed in the chamber CH. A driving device connected to the first stage 100 may be further disposed under the first stage 100. Accordingly, the first stage 100 may move up and down in the first direction DR1.

In an embodiment, the plurality of base plates 200 may be disposed on the first stage 100. A material (e.g., a first material M1, a second material M2, and a third material M3 of FIG. 11) may be placed on the plurality of base plates 200. Specifically, the material may be disposed on the plurality of base plates 200 while being fixed by the jig 600 described later.

In an embodiment, the number of the plurality of base plates 200 may be three. For example, the plurality of base plates 200 may include a first plate 202, a second plate 204, and a third plate 206. The first plate 202 may be disposed on a center of the first stage 100.

The second plate 204 may be disposed on a first side of the first plate 202. The third plate 206 may be disposed on a second side of the first plate 202. The second side of the first plate 202 may be opposite to the first side of the first plate 202 based on an imaginary center line passing through a center of the chamber CH and extending in a third direction DR3. The third direction DR3 may cross the first direction DR1. In an embodiment, for example, the first direction DR1 and the third direction DR3 may be perpendicular to each other. However, the present disclosure is not limited thereto, and the number of the plurality of base plates 200 may be two, four, or more.

Each of the first plate 202, the second plate 204, and the third plate 206 may have various shapes.

In an embodiment, for example, the first plate 202 may have a '圭' shape on a plane (e.g., the plane may be defined by a second direction DR2 and the third direction DR3). The second direction DR2 may cross each of the first direction DR1 and the third direction DR3. In an embodiment, for example, the second direction DR2 may be perpendicular to each of the first direction DR1 and the third direction DR3. The '圭' shape may include a first horizontal portion, a first vertical portion, a second horizontal portion, a second vertical portion, and a third horizontal portion. The first horizontal portion may extend in the second direction DR2. The first vertical portion may extend in the third direction DR3 and be connected to the first horizontal portion. The second horizontal portion may extend in the second direction DR2 and may be connected to the first vertical portion. The second vertical portion may extend in the third direction DR3 and may be connected to the second horizontal portion. The third horizontal portion may extend in the second direction DR2 and may be connected to the second vertical portion.

On the other hand, each of the second plate 204 and the third plate 206 may have a '⊏' shape on the plane (i.e., in a plan view). The '⊏' shape may include a fourth horizontal portion, a third vertical portion, and a fifth horizontal portion. The fourth horizontal portion may extend in the second direction DR2. The third vertical portion may extend in the third direction DR3 and may be connected to the fourth horizontal portion. The fifth horizontal portion may extend in the second direction DR2 and may be connected to the third vertical portion.

In FIG. 2, the first plate 202 is shown in the '王' shape, but the present disclosure is not limited thereto. The first plate 202 may have a symmetrical shape based on the imaginary center line passing through the center of the chamber CH and extending in the third direction DR3. In an embodiment, for example, the first plate 202 may have a meander shape in which both sides are symmetrical with respect to the imaginary center line. The meander shape may be a wavy shape in which the letters 'S' are connected.

Even though each of the second plate 204 and the third plate 206 is shown in the '⊏' shape, but the present disclosure is not limited thereto. Each of the second plate 204 and the third plate 206 may have a different shape (e.g., 'Z', 'C', etc.) as long as each of the second plate 204 and the third plate 206 does not interfere with the first plate 202.

However, the present disclosure is not limited thereto, and the plurality of base plates 200 may fix the jig 600 and may have various shapes that do not cause interference during alignment.

Each of the first plate 202, the second plate 204, and the third plate 206 may have a variety of sizes. In an embodiment, for example, a size of the first plate 202 may be larger than a size of each of the second plate 204 and the third plate 206. However, the present disclosure is not limited thereto, and the size of the first plate 202 may be equal to the size of each of the second plate 204 and the third plate 206 in another embodiment. Alternatively, the size of the first plate 202 may be smaller than the size of each of the second plate 204 and the third plate 206.

In an embodiment, the plurality of second stages 300 may be disposed under the first stage 100.

In an embodiment, the number of the plurality of second stages 300 may be three. For example, the plurality of second stages 300 may include a first alignment stage 302, a second alignment stage 304, and a third alignment stage 306. The first alignment stage 302 may be connected to the first plate 202. The second alignment stage 304 may be disposed on the first alignment stage 302 and may be connected to the second plate 204. The third alignment stage 306 may be disposed on the first alignment stage 302 and may be connected to the third plate 206.

Accordingly, when the first alignment stage 302 is driven, the second alignment stage 304 and the third alignment stage 306 may be driven together. In other words, when the first alignment stage 302 is driven, the first plate 202, the second plate 204, and the third plate 206 may be driven together. On the other hand, only the second plate 204 among the first to third plates 202, 204 and 206 may be driven when only the second alignment stage 304 among the first to third alignment stages 302, 304 and 306 is driven, and only the third plate 206 among the first to third plates 202, 204 and 206 may be driven when only the third alignment stage 306 among the first to third alignment stages 302, 304 and 306 is driven.

In an embodiment, the plurality of second stages 300 may be connected to the plurality of base plates 200, respectively. In an embodiment, for example, the first alignment stage 302 may be connected to the first plate 202, the second alignment stage 304 may be connected to the second plate 204, and the third alignment stage 306 may be connected to the third plate 206. Accordingly, the plurality of second stages 300 may align each of the plurality of base plates 200 in X, Y, and θ directions. In an embodiment, for example, each of the plurality of second stages 300 may be a UVW stage. A detailed description of the UVW stage will be described later with reference to FIG. 5.

In an embodiment, the number of the plurality of pitch control units 400 may be two. For example, the plurality of pitch control units 400 may include a first pitch control unit 402 and a second pitch control unit 404. The first pitch control unit 402 may be disposed between the first alignment stage 302 and the second alignment stage 304. The second pitch control unit 404 may be disposed between the first alignment stage 302 and the third alignment stage 306.

In an embodiment, the plurality of pitch control units 400 may move in a horizontal direction (i.e., the second direction DR2). The material may be disposed on the plurality of base plates 200. The materials may be plural. Size of the plurality of materials or a gap between the plurality of materials (e.g., a first gap d1 in FIG. 10, a second gap d2 in FIG. 10, and a third gap d3 in FIG. 11, and a fourth gap d4 in FIG. 11) may vary depending on a product.

Each of the second plate 204 and the third plate 206 may be moved in the horizontal direction (i.e., the second direction DR2) by the plurality of pitch control units 400. Accordingly, each of the second plate 204 and the third plate 206 may be spaced apart from the first plate 202. Or, each of the second plate 204 and the third plate 206 may be proximate to the first plate 202. In an embodiment, for example, the plurality of pitch control units 400 may adjust the gap between the plurality of materials in units of about millimeters (mm). Through this, the alignment device 1 may correspond to the plurality of materials having various sizes or various gaps. A detailed description of the plurality of pitch control units 400 will be described later with reference to FIGS. 6 and 7.

In an embodiment, the plurality of load distribution units 500 may be disposed between the first stage 100 and the plurality of base plates 200. Specifically, the plurality of load distribution units 500 may include a first load distribution unit 502 and a second load distribution unit 504. The first load distribution unit 502 may be disposed under the second plate 204, and the second load distribution unit 504 may be disposed under the third plate 206. As described above, each of the first load distribution unit 502 and the second load distribution unit 504 may be disposed spaced apart from the first plate 202. In an embodiment, for example, the first plate 202 may have the '王' shape in the plan view. Each of the second plate 204 and the third plate 206 may have the '⊏' shape in the plan view.

In an embodiment, each of the plurality of load distribution units 500 may include a guide rail GR and a cross roller CR.

In an embodiment, for example, the guide rail GR may be a linear motion ("LM") guide. The LM guide may be defined as a linear motion component that moves without shaking in a rail direction. The guide rails GR may be installed in each of the second direction DR2 and the third direction DR3.

The cross roller CR may be disposed on the guide rail GR. The cross roller CR may move along the guide rail GR. The plurality of load distribution units 500 may be constrained only in a height direction (e.g., in the first direction DR1), and may not be constrained in a plane direction (i.e., in a direction parallel to a plane defined by the second direction DR2 and the third direction DR3). Accordingly, the plurality of load distribution units 500 may distribute a load applied to the plurality of base plates 200. A detailed description of the plurality of load distribution units 500 will be described later with reference to FIGS. 8 and 9.

In an embodiment, the jig 600 may be disposed on the plurality of base plates 200.

In an embodiment, the number of the jig 600 may be three. For example, the jig 600 may include a first jig 602, a second jig 604, and a third jig 606. The first jig 602 may be disposed on the first plate 202. The second jig 604 may be disposed on the second plate 204, and the third jig 606 may be disposed on the third plate 206. However, the present disclosure is not limited thereto, and the number of the jig 600 may be two, four, or more in another embodiment.

In an embodiment, the jig 600 may be arranged to overlap at least two of the first plate 202, the second plate 204, and the third plate 206. In this case, a groove may be formed on a lower surface of the jig 600. Since the groove may be formed in the jig 600, friction between the plurality of base plates 200 and the jig 600 may be reduced when the plurality of base plates 200 move in the horizontal direction (i.e., the second direction DR2).

The material may be placed on the jig 600. In an embodiment, the material may be a display panel. The display panel may be a flat display panel or a curved display panel. In another embodiment, the material may be the cover glass protecting the display panel. However, the present disclosure is not limited thereto, and a type of the materials placed on the jig 600 may be various, such as a film and a circuit board.

In an embodiment, the vision unit 700 may be disposed on the plurality of base plates 200. For example, the vision unit 700 may be a vision camera. In an embodiment, for example, the vision camera may recognize an align mark located on the material. The align mark may be recognized by the vision camera, and then the align mark may be image-processed. Through this, a position may be determined where the material is to be seated on the plurality of base plates 200.

In addition, the plurality of second stages 300 and the plurality of pitch control units 400 may be controlled based on calibration data before the material may be placed. Through this, alignment accuracy of the material may be enhanced. However, the present disclosure is not limited thereto, and the vision unit 700 may be omitted.

Figure 5:
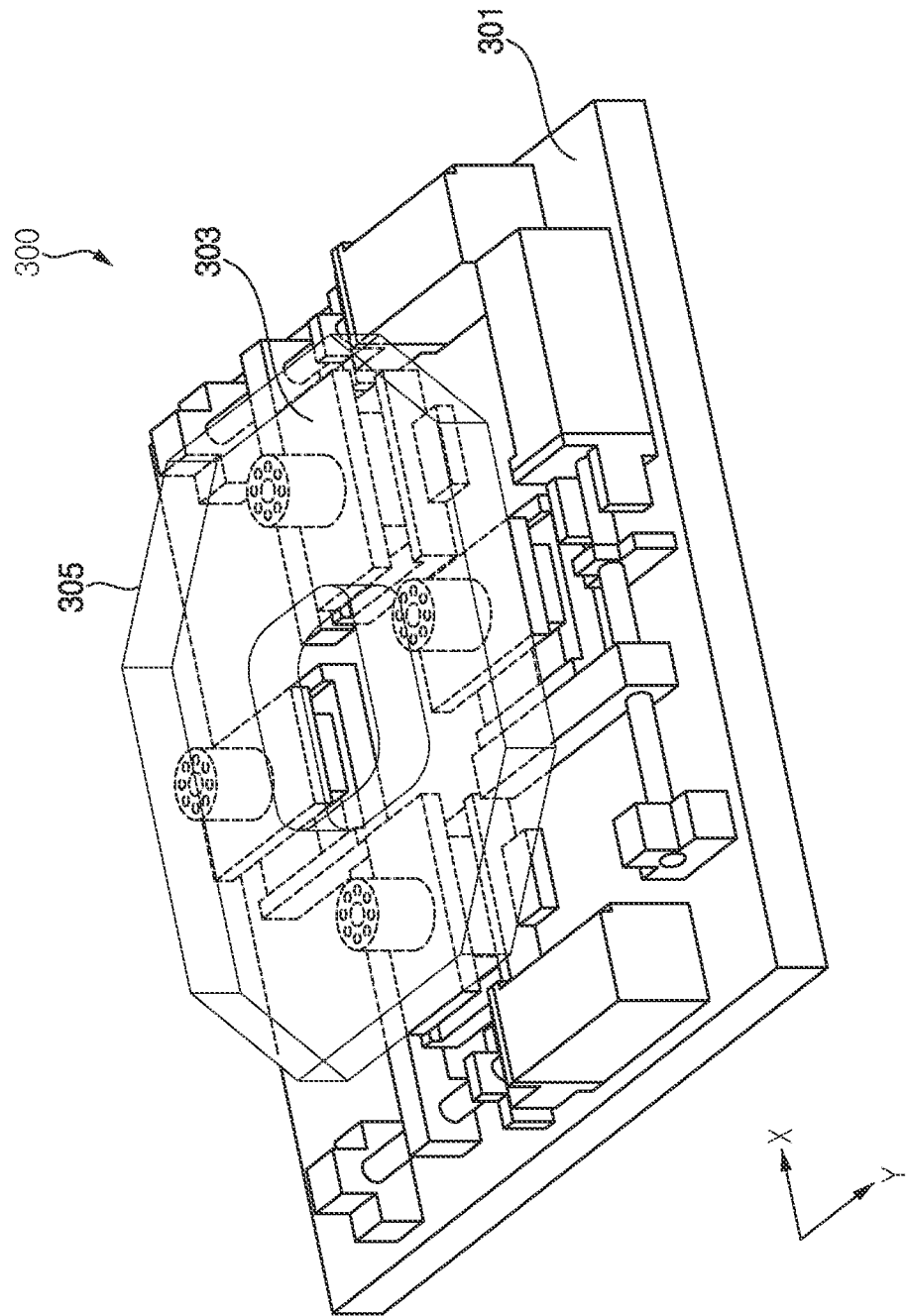
FIG. 5 is a perspective view illustrating the plurality of second stages included in the alignment device of FIG. 1.

FIG. 5 is a perspective view illustrating the plurality of second stages included in the alignment device of FIG. 1.

In an embodiment, each of the plurality of second stages 300 may be the UVW stage. The UVW stage may perform alignment in the X, Y, and θ directions with greater precision than a linear movement stage. Here, θ direction is a rotational direction with respect to a normal direction perpendicular to a plane defined by the X direction and the Y direction.

Referring to FIG. 5, the UVW stage may include a base plate 301, a roller unit 303, and a top plate 305.

The roller unit 303 may be disposed on the base plate 301. The roller unit 303 may be disposed in a vertically and horizontally symmetrical structure. The roller unit 303 may include a screw, a nut, and a rail. Each of the screw, the nut, and the rail may be connected to a servo-motor.

The top plate 305 may be disposed on the roller unit 303. The top plate 305 may move in the X, Y, and θ directions. More specifically, first to third axes may be positioned on the base plate 301. The second and third axes may be positioned in a direction crossing the first axes. (That is, the second axis and the third axis may be positioned at both ends of the base plate 301.) When the first axis is driven, the top plate 305 may move in the X direction. When the second axis and the third axis are simultaneously driven, the top plate 305 may move in the Y direction. When the first to third axes are simultaneously driven, the top plate 305 may move in the θ direction. (That is, the top plate 305 may rotate.)

Figure 6:
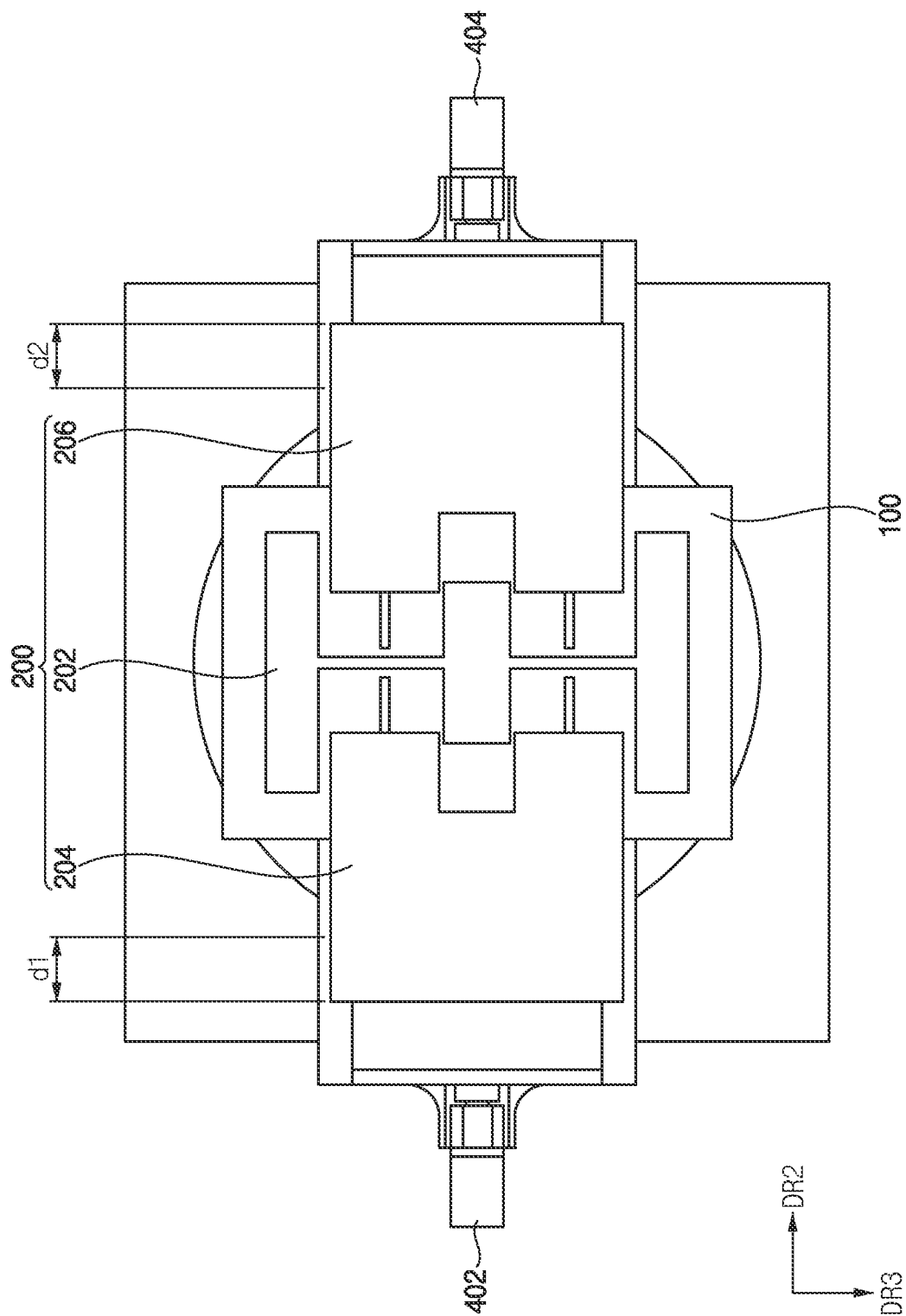
FIGS. 6 and 7 are plan views illustrating the plurality of pitch control units included in the alignment device of FIG. 1.
Figure 7:
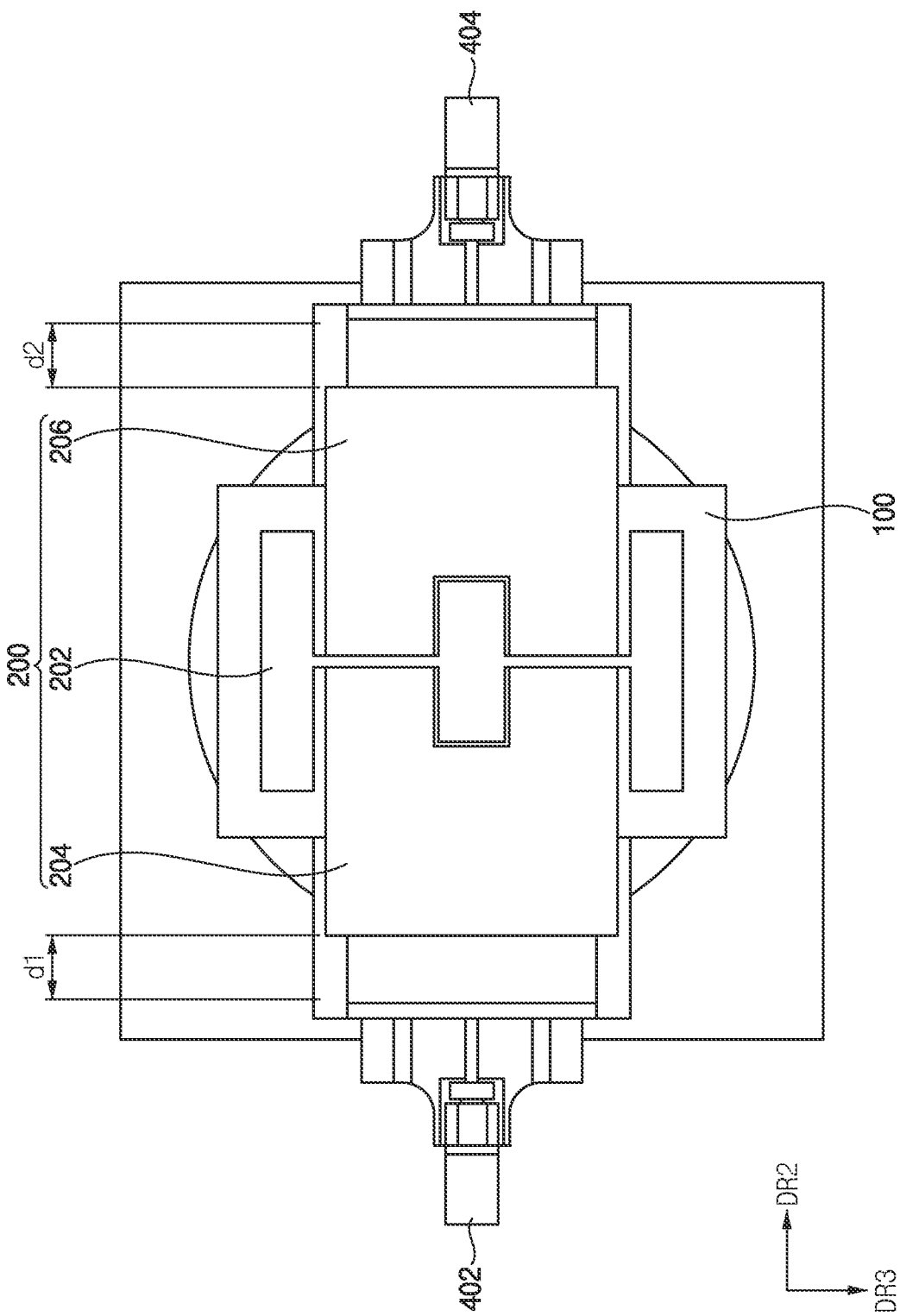

FIGS. 6 and 7 are plan views illustrating the plurality of pitch control units included in the alignment device of FIG. 1.

Referring to FIGS. 1, 4, 6, and 7, the alignment device 1 may include the plurality of pitch control units 400.

In an embodiment, the first pitch control unit 402 may be disposed between the first alignment stage 302 and the second alignment stage 304. The second pitch control unit 404 may be disposed between the first alignment stage 302 and the third alignment stage 306. The first pitch control unit 402 may be connected to the second plate 204, and the second pitch control unit 404 may be connected to the third plate 206.

In an embodiment, each of the first pitch control unit 402 and the second pitch control unit 404 may move in the horizontal direction (i.e., the second direction DR2). Accordingly, each of the second plate 204 connected to the first pitch control unit 402 and the third plate 206 connected to the second pitch control unit 404 may move in the horizontal direction (i.e., the second direction DR2). That is, the second plate 204 and/or the third plate 206 may be proximate or be spaced apart from the first plate 202 through the plurality of pitch control units 400 in the horizontal direction (i.e., the second direction DR2).

In an embodiment, the first pitch control unit 402 may move in the horizontal direction (i.e., the second direction DR2) by the first gap d1. The second pitch control unit 404 may move in the horizontal direction (i.e., the second direction DR2) by the second gap d2. Accordingly, the second plate 204 may move in the horizontal direction (i.e., the second direction DR2) by the first gap d1. The third plate 206 may move in the horizontal direction (i.e., the second direction DR2) by the second gap d2.

Figure 8:
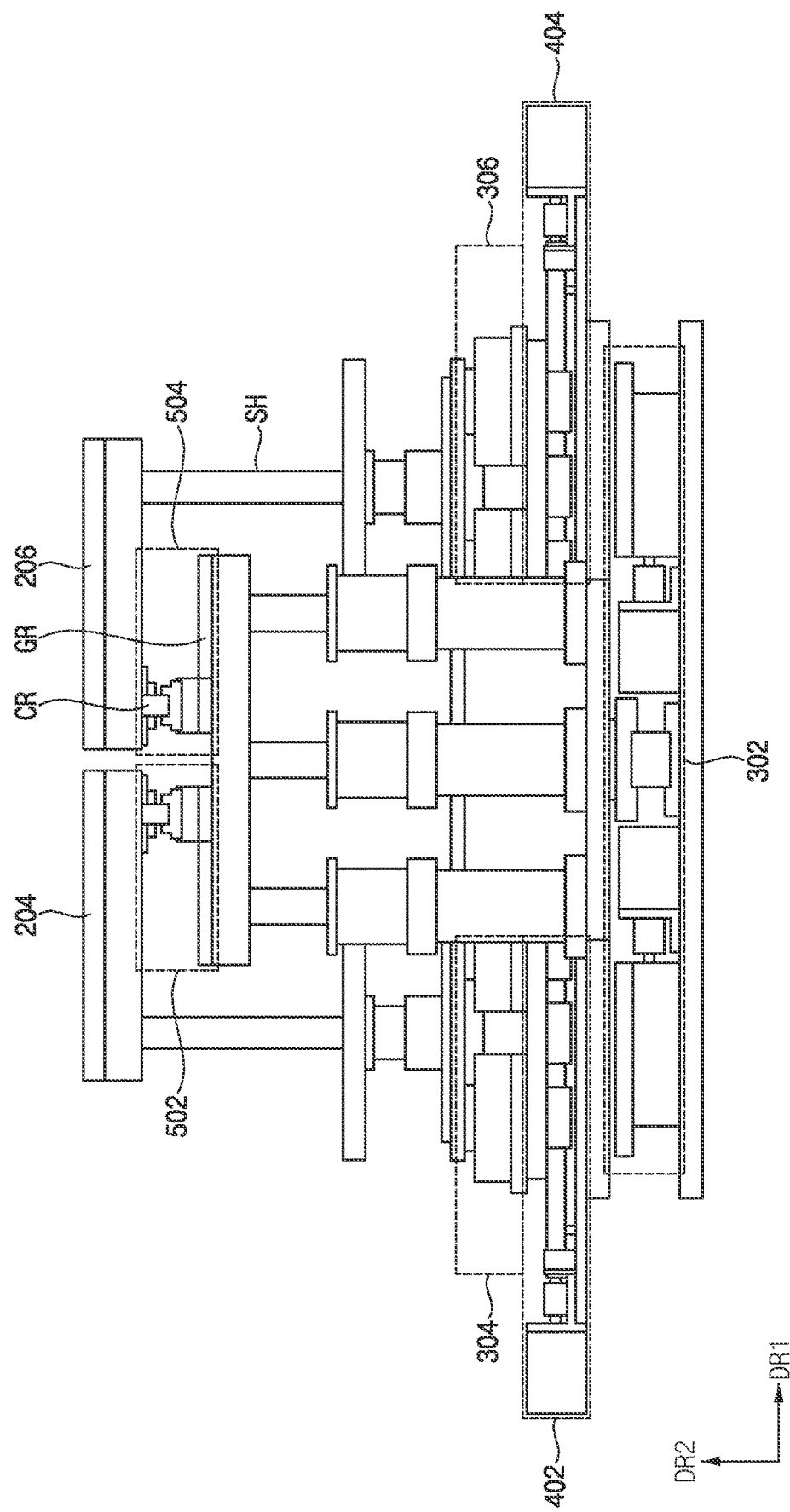
FIGS. 8 and 9 are views illustrating the plurality of load distribution units included in the alignment device of FIG. 1.
Figure 9:
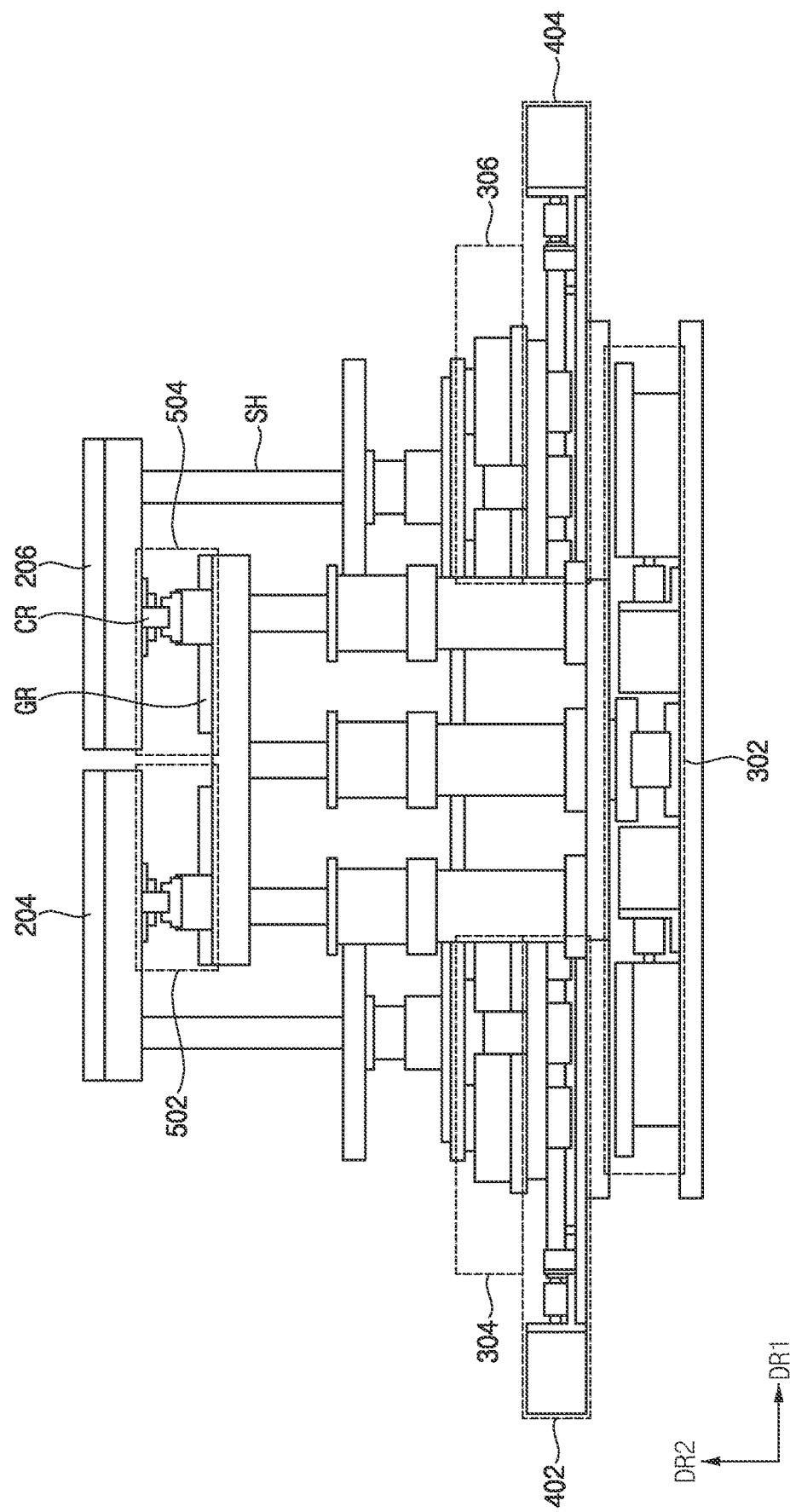

FIGS. 8 and 9 are views illustrating the plurality of load distribution units included in the alignment device of FIG. 1.

Referring to FIGS. 1, 3, 8, and 9, the alignment device 1 may include the plurality of load distribution units 500.

In an embodiment, the first load distribution unit 502 may be disposed under the second plate 204, and the second load distribution unit 504 may be disposed under the third plate 206.

In an embodiment, each of the plurality of load distribution units 500 may include the guide rail GR and the cross roller CR movable along the guide rail GR.

When the second alignment stage 304 moves, the second plate 204 may move. When the second plate 204 moves, the first load distribution unit 502 may move. Accordingly, the first load distribution unit 502 may distribute a load applied to the second plate 204 in the height direction (i.e., the first direction DR1).

When the third alignment stage 306 moves, the third plate 206 may move. When the third plate 206 moves, the second load distribution unit 504 may move. Accordingly, the second load distribution unit 504 may distribute a load applied to the third plate 206 in the height direction (i.e., the first direction DR1).

Specifically, when the second plate 204 and/or the third plate 206 move, the cross roller CR may move along the guide rail GR. In a state where the cross roller CR may be stopped, a first side of the second plate 204 may be supported by a shaft SH connected to the second alignment stage 304. A second side of the second plate 204 may be supported by the first load distribution unit 502. Similarly, a first side of the third plate 206 may be supported by the shaft SH connected to the third alignment stage 306. A second side of the third plate 206 may be supported by the second load distribution unit 504. Accordingly, the alignment device 1 according to an embodiment of the present disclosure may distribute the load applied to the plurality of base plates 200 compared to an alignment device according to a comparative embodiment having a cantilever structure (i.e., a structure in which the second plate 204 and the third plate 206 are supported only by the shaft SH).

Figure 11:
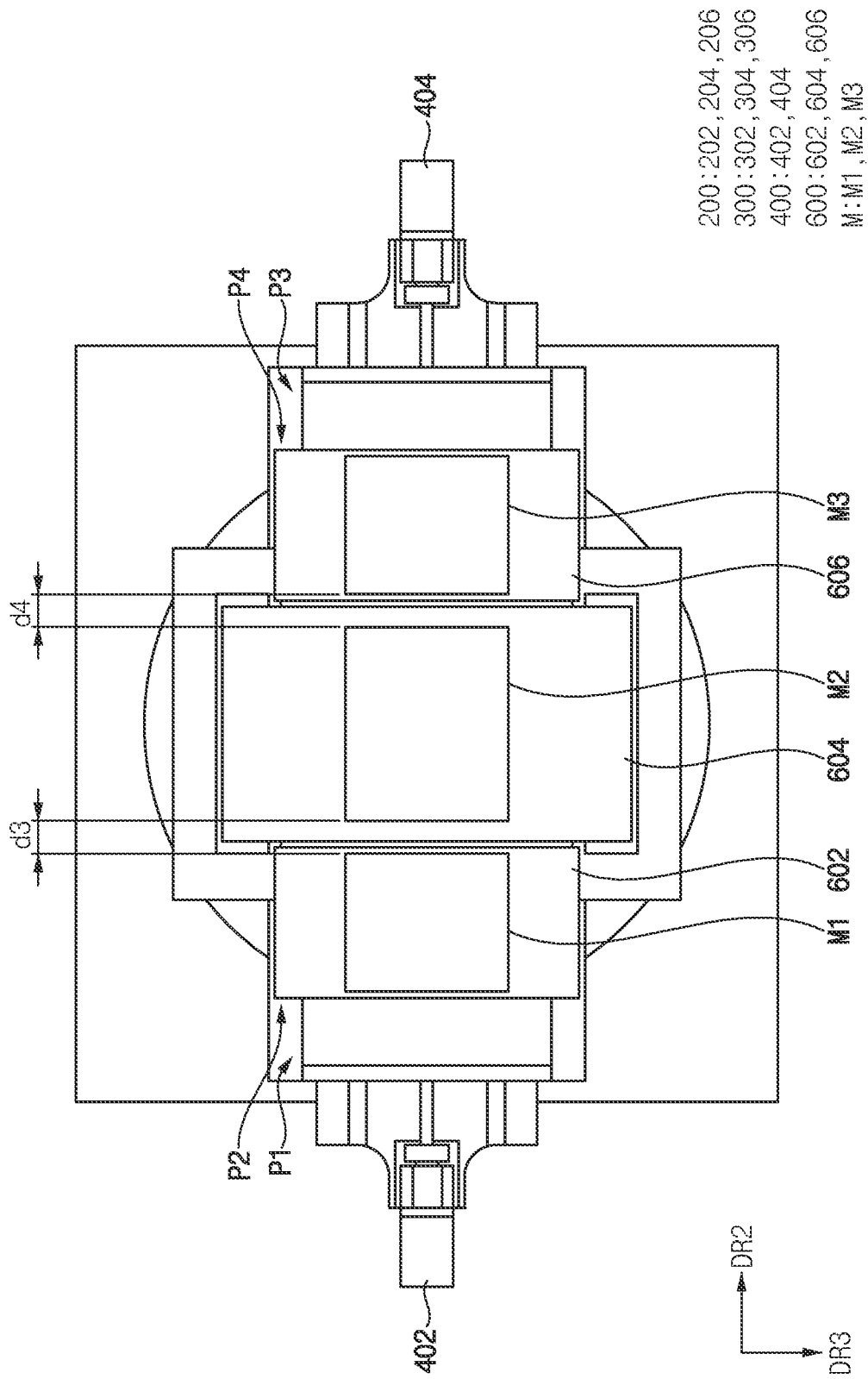

As described above, the alignment device according to an embodiment of the present disclosure (e.g., the alignment device 1 of FIG. 1) may align the plurality of materials (e.g., the first material M1, the second material M2, and the third material M3 of FIG. 11) at once by including the plurality of base plates 200.

In addition, the alignment device may align each of the plurality of base plates 200 by further including the plurality of second stages 300.

In addition, the alignment device may handle the plurality of materials having various sizes and gaps with one facility by further including the plurality of pitch control units 400.

In addition, the alignment device may distribute the load applied to the plurality of base plates 200 when pressurized from above by further including the plurality of load distribution units 500.

FIGS. 10, 11, 12, 13, and 14 are views illustrating a material alignment method using the alignment device of FIG. 1. Hereinafter, the method of alignment of a material M using the alignment device 1 of FIG. 1 will be described in order.

Figure 10:
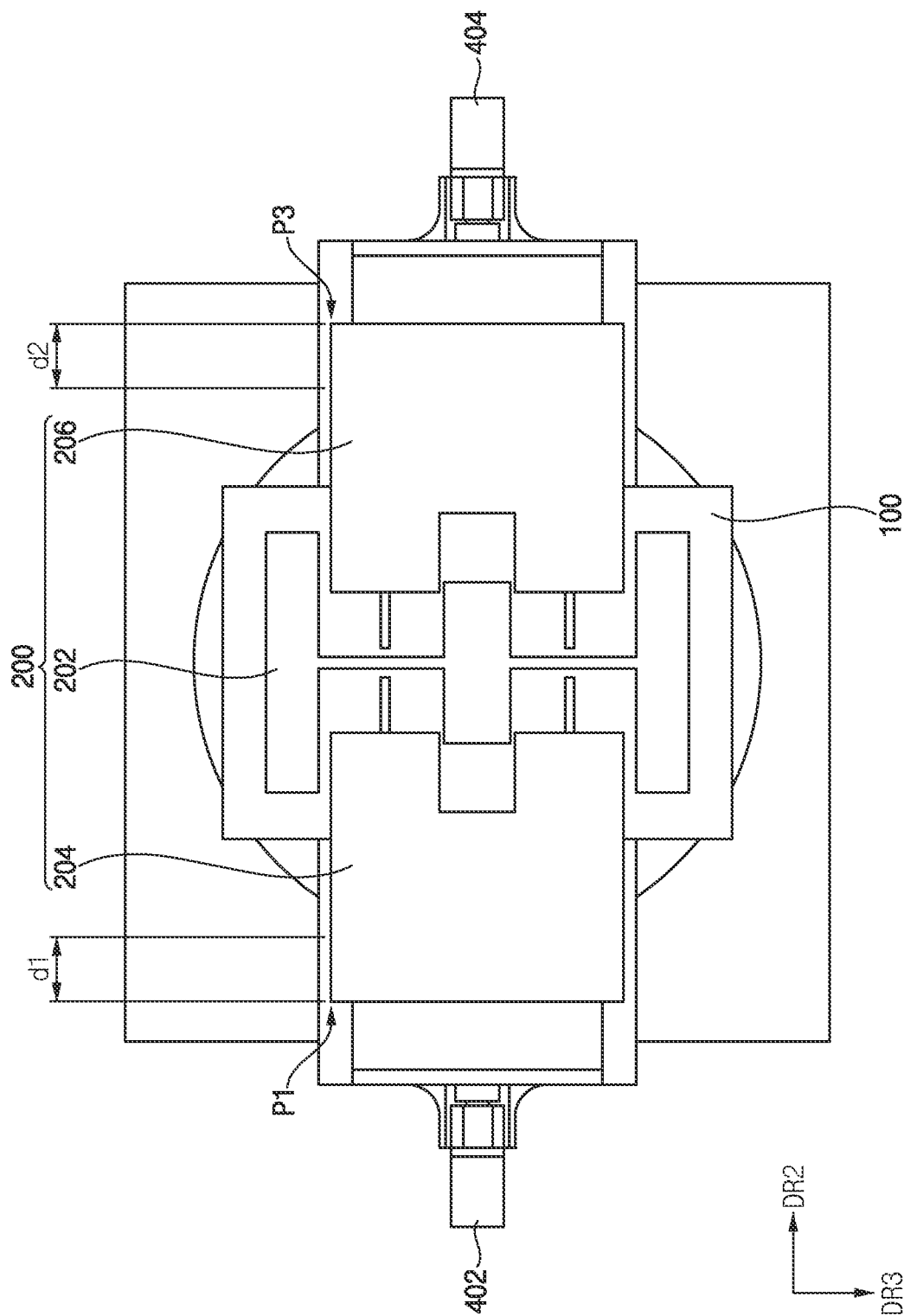
FIGS. 10, 11, 12, 13, and 14 are views illustrating a material alignment method using the alignment device of FIG. 1.

Referring to FIGS. 10 and 11, positions of the plurality of base plates 200 may be determined using the plurality of pitch control units 400.

In an embodiment, for example, the first plate 202 may be fixed to the first stage 100. The first pitch control unit 402 may move the second plate 204 in the horizontal direction (i.e., the second direction DR2). The second pitch control unit 404 may move the third plate 206 in the horizontal direction (i.e., the second direction DR2). Accordingly, a seating area of the material M or the gap between the materials (e.g., the first gap d1 in FIG. 10, the second gap d2 in FIG. 10, the third gap d3 in FIG. 11, and the fourth gap d4 in FIG. 11) may be increased or decreased.

The first pitch control unit 402 may position a first vertex of the second plate 204 at a first position P1. In addition, the first pitch control unit 402 may position the vertex of the second plate 204 at a second position P2. The second position P2 may be closer to the center of the first stage 100 than the first position P1. The first pitch control unit 402 may move the second plate 204 by the first gap d1. Accordingly, the second pitch control unit 404 may adjust the seating area of the material M or the third gap d3 between the first material M1 and the second material M2.

Similarly, the second pitch control unit 404 may move the third plate 206. Accordingly, the second pitch control unit 404 may adjust the seating area of the material M or the fourth gap d4 between the second material M2 and the third material M3.

Referring to FIG. 11, the material M may be disposed on the plurality of base plates 200. At this time, the jig 600 may be disposed on the plurality of base plates 200, and the material M may be seated on the jig 600. In an embodiment, for example, the jig 600 may be a vacuum chuck, and the material M may be the display panel. The vacuum chuck may adsorb the display panel. Accordingly, the jig 600 may be fixed so that the material M may not be moved during a process.

Figure 12:
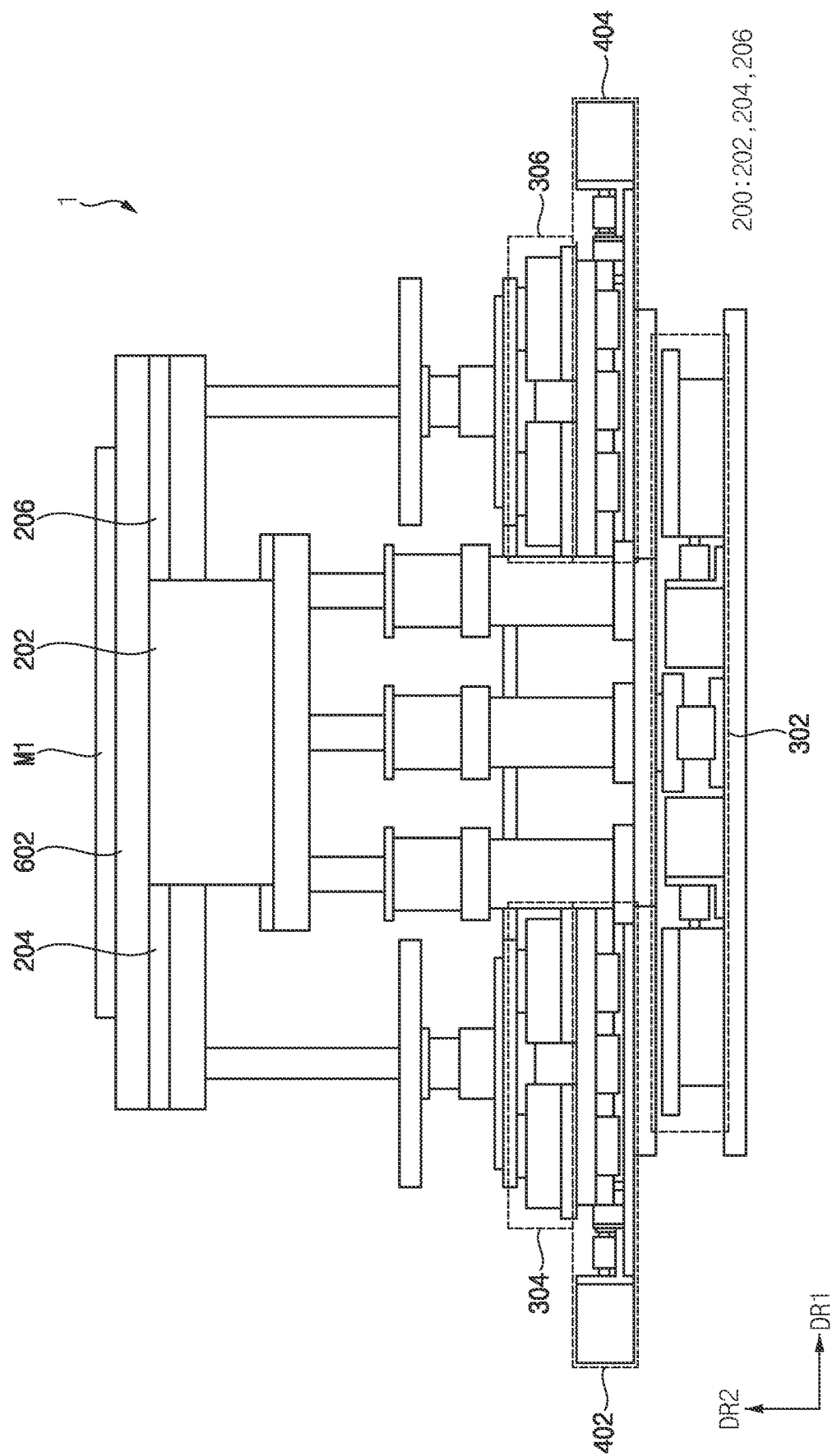

Referring to FIG. 12, one material (e.g., the first material M1) may be disposed on the plurality of base plates 200. In this case, the first jig 602 may be disposed on the plurality of base plates 200, and the first material M1 may be placed on the first jig 602. In this case, the first material M1 may be placed on the first jig 602 such that a center of the first material M1 may coincide with a center of the first plate 202. When the seating area of the first material M1 may be insufficient, the seating area may be increased using the plurality of pitch control units 400 as described above. After that, the first plate 202 may be aligned by the first alignment stage 302.

Figure 13:
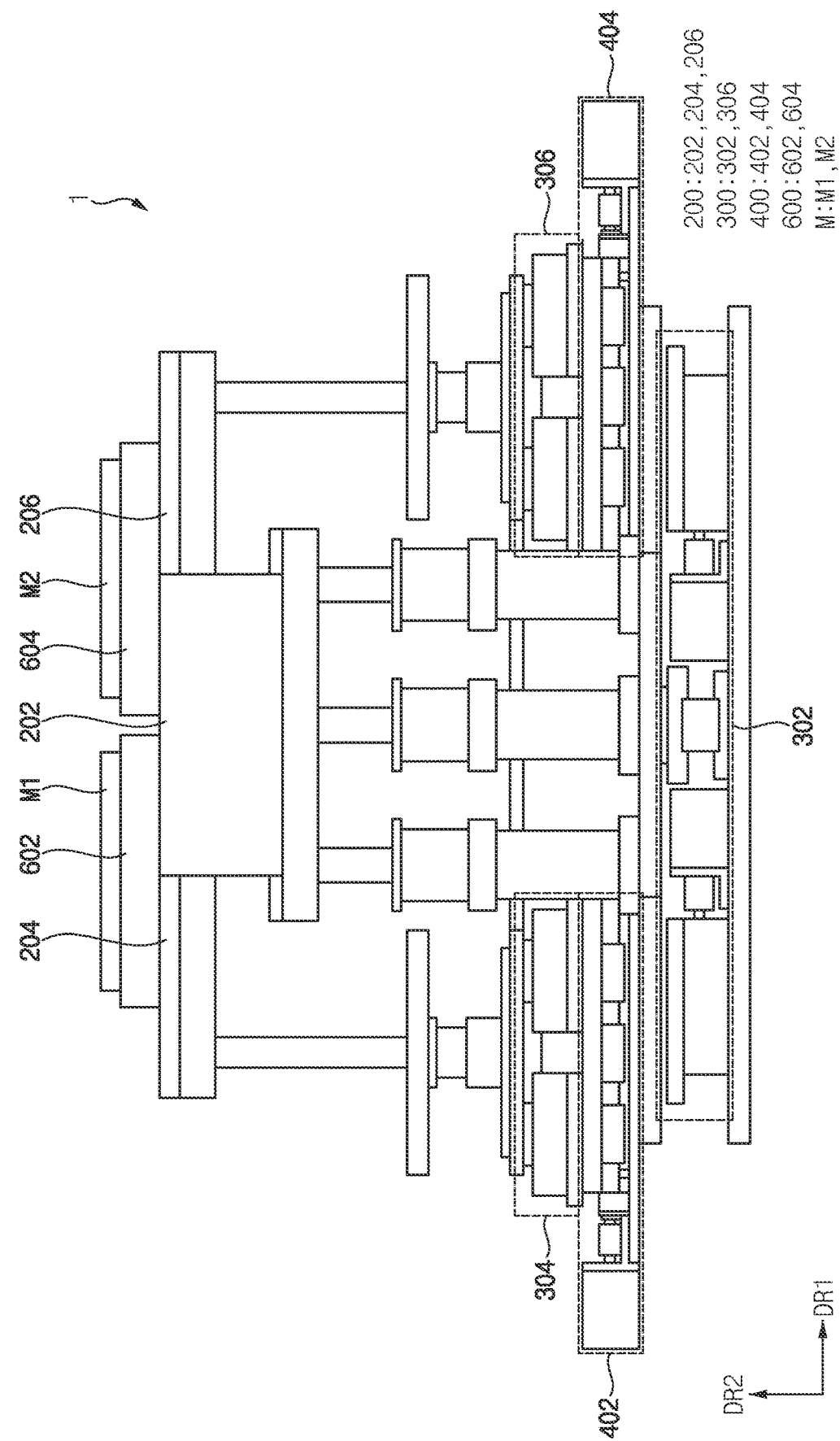

Referring to FIG. 13, two materials (e.g., the first material M1 and the second material M2) may be disposed on the plurality of base plates 200. In this case, the positions of the plurality of base plates 200 may be first determined using the plurality of pitch control units 400. Specifically, the second plate 204 may be moved in the horizontal direction (i.e., the second direction DR2) using the first pitch control unit 402, or the third plate 206 may be moved in the horizontal direction (i.e., the second direction DR2) using the second pitch control unit 404. Accordingly, the center of the first material M1 may coincide with a center of the second plate 204, and the center of the second material M2 may coincide with a center of the third plate 206. And then, the first material M1 may be placed on the first jig 602, and the second material M2 may be placed on the second jig 604. The second plate 204 may be aligned using the first alignment stage 302 and/or the second alignment stage 304. The third plate 206 may be aligned using the first alignment stage 302 and/or the third alignment stage 306.

Figure 14:
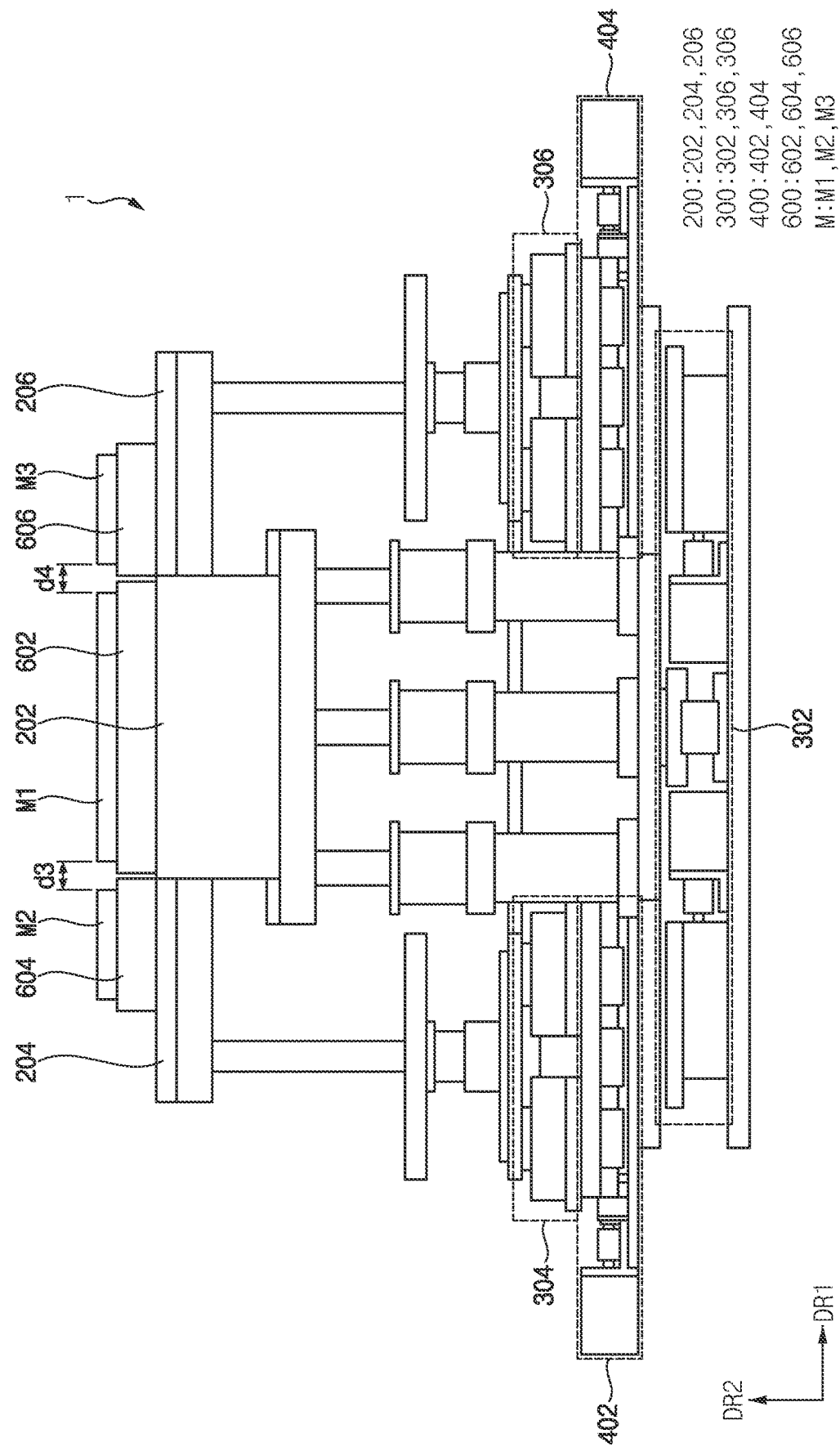

Referring to FIG. 14, three materials (e.g., the first material M1, the second material M2, and the third material M3) may be disposed on the jig 600. The jig 600 may be disposed on the plurality of base plates 200. As described above, the positions of the plurality of base plates 200 may be determined first, and then the three materials M1, M2, and M3 may be placed on the plurality of base plates 200. Specifically, the plurality of pitch control units 400 may control the third gap d3 and/or the fourth gap d4.

At least one of the first jig 602, the second jig 604, and the third jig 606 may be arranged to overlap at least two of the first plate 202, the second plate 204, and the third plate 206 in a front view (e.g., the plane defined by the first direction DR1 and the second direction DR2). In an embodiment, for example, the third jig 606 may be arranged to overlap the first plate 202 and the third plate 206. In this case, the groove may be formed on the lower surface of the third jig 606. Since the groove may be formed in the third jig 606, friction between the first plate 202, the third plate 206 and the third jig 606 may be reduced when the first plate 202 and the third plate 206 move in the horizontal direction (i.e., the second direction DR2).

The first plate 202, the second plate 204, and the third plate 206 may be aligned by the first alignment stage 302, the second alignment stage 304, and the third alignment stage 306. Specifically, the first plate 202, the second plate 204, and the third plate 206 may be moved by the first alignment stage 302. Only the second plate 204 may be moved by the second alignment stage 304. Only the third plate 206 may be moved by the third alignment stage 306. That is, each of the plurality of base plates 200 may be aligned by the plurality of second stages 300.

Figure 15:
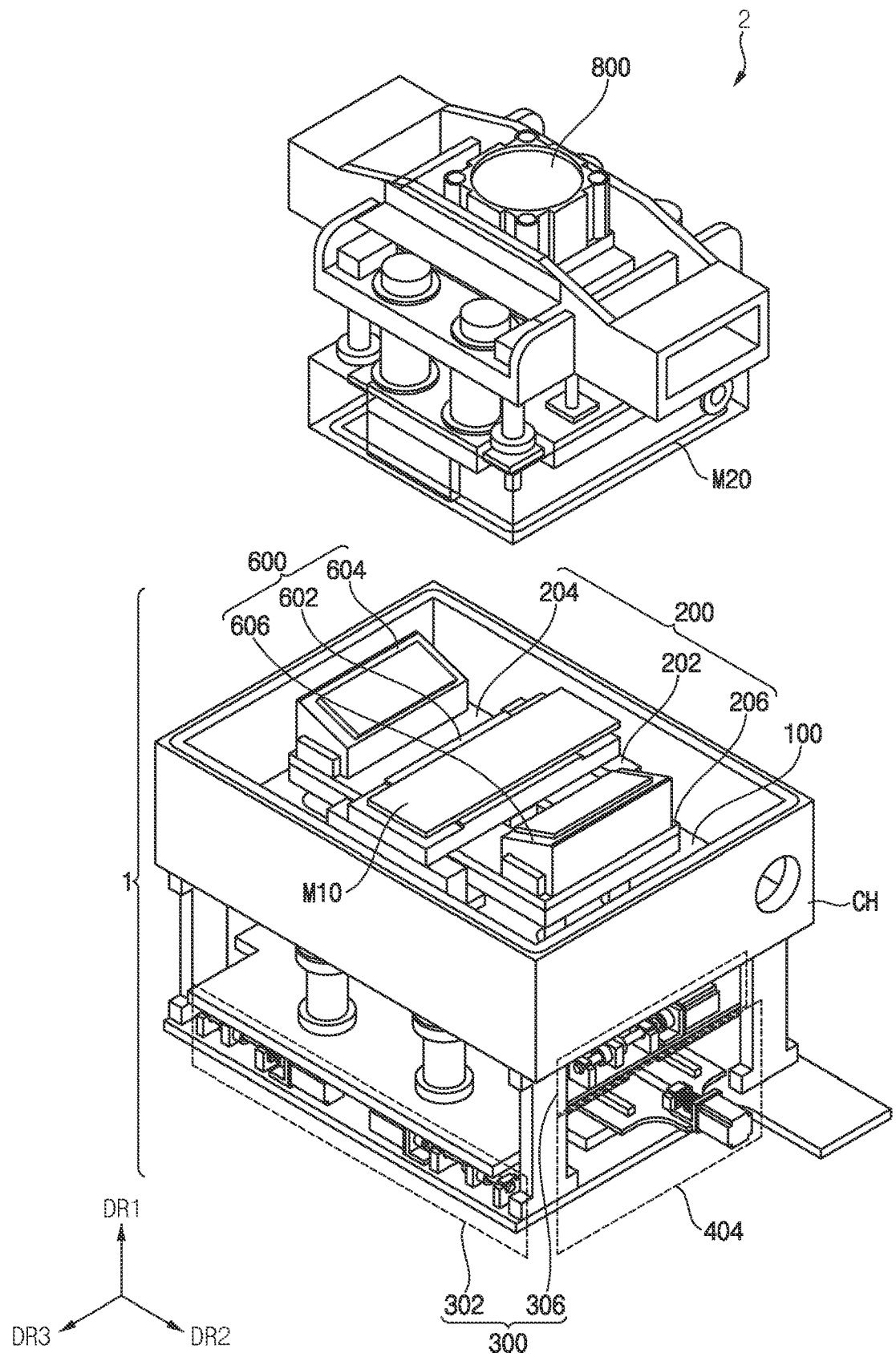
FIG. 15 is a perspective view of a lamination device including the alignment device of FIG. 1.

FIG. 15 is a perspective view of a lamination device including the alignment device of FIG. 1.

Referring to FIGS. 1, 3, 4, and 15, the lamination device 2 may include the alignment device 1 and a pressure unit 800. The alignment device 1 may include the chamber CH, the first stage 100, the plurality of base plates 200, the plurality of second stages 300, the plurality of pitch control units 400, the plurality of load distribution units 500, the jig 600 and the vision unit 700. Here, the alignment device 1 shown in FIG. 15 may correspond to the alignment device 1 described with reference to FIGS. 1, 2, 3, 4, 5, 6, 7, 8, and 9. Therefore, in the following, redundant descriptions are omitted or simplified.

In an embodiment, the pressure unit 800 may be disposed on the alignment device 1. A first material M10 may be placed on the alignment device 1 and a second material M20 may be placed on the pressure unit 800. The first material M10 shown in FIG. 15 may correspond to the material (e.g., the material M, the first material M1, the second material M2, and the third material M3 of FIG. 11) described with reference to FIGS. 1, 2, 3, 4, 5, 6, 7, 8, and 9. The pressure unit 800 may apply pressure to the first material M10 and the second material M20 so that the first material M10 and the second material M20 may be laminated. In an embodiment, the first material M10 may be the display panel, and the second material M20 may be the cover glass. In an embodiment, for example, the display panel may be the vehicle display panel.

The lamination device 2 may include the plurality of base plates 200. Accordingly, even the plurality of first materials M10 may be aligned at once. In an embodiment, for example, the plurality of vehicle display panels may be laminated to the cover glass. To this end, the positions of each of the plurality of display panels may be aligned by the plurality of base plates 200 before laminating to the cover glass. Accordingly, a tact time may be shorter than that of sequentially laminating the display panels on the cover glass.

In addition, the lamination device 2 may include the plurality of second stages 300. Accordingly, each of the plurality of base plates 200 may be aligned. So, the positions where the display panels are laminated on the cover glass may be precisely controlled.

In addition, the lamination device 2 may include the plurality of pitch control units 400. Accordingly, the plurality of first materials M10 having various sizes and gaps may be handled using only one facility.

In addition, the lamination device 2 may include the plurality of load distribution units 500. Accordingly, the load applied to the plurality of base plates 200 may be distributed when the plurality of base plates 200 is pressurized by the pressure unit 800.

In FIG. 15, the lamination device 2 including the alignment device 1 has been described. However, the present disclosure is not limited thereto. The alignment device 1 and the lamination device 2 according to embodiments of the present disclosure may be applied to various facilities. In an embodiment, for example, the alignment device 1 may be applied to various equipment requiring the alignment, such as a laser cutting device, a bending device, a bonding device, and a film removing device.

The alignment device and the lamination device including the alignment device according to embodiments of the present disclosure may be applied to a display device included in a computer, a notebook, a mobile phone, a smartphone, a smart pad, a PMP, a PDA, an MP3 player, a mobile body, or the like.

Although the methods and the systems according to the embodiments have been described with reference to the drawings, the illustrated embodiments are examples, and may be modified and changed by a person having ordinary knowledge in the relevant technical field without departing from the technical spirit described in the following claims.

What is claimed is:

1. An alignment device comprising:
a first stage;
a plurality of base plates disposed on the first stage and on which a material is placed; and
a plurality of second stages disposed under the first stage, and connected to the plurality of base plates, respectively,
wherein each of the plurality of second stages is capable of aligning a base plate, of the plurality of base plates, connected to the each of the plurality of second stages in X, Y, and θ directions.

2. The alignment device of claim 1, wherein the plurality of base plates includes:
a first plate disposed on a center of the first stage;
a second plate disposed on a first side of the first plate; and
a third plate disposed on a second side of the first plate opposite to the first side.

3. The alignment device of claim 2, wherein the plurality of second stages includes:
a first alignment stage connected to the first plate;
a second alignment stage disposed on the first alignment stage, and connected to the second plate; and
a third alignment stage disposed on the first alignment stage, and connected to the third plate.

4. The alignment device of claim 3, further comprising:
a first pitch control unit disposed between the first alignment stage and the second alignment stage, and capable of horizontal movement; and
a second pitch control unit disposed between the first alignment stage and the third alignment stage, and capable of horizontal movement.

5. The alignment device of claim 2, further comprising:
a plurality of load distribution units disposed between the first stage and the plurality of base plates,
wherein each of the plurality of load distribution units includes:
a guide rail; and
a cross roller movable along the guide rail.

6. The alignment device of claim 5, wherein,
the plurality of load distribution units includes a first load distribution unit and a second load distribution unit,
the first load distribution unit is disposed under the second plate, and
the second load distribution unit is disposed under the third plate.

7. The alignment device of claim of 1, wherein each of the plurality of second stages is a UVW stage.

8. The alignment device of claim of 1, further comprising:
at least one jig disposed on the plurality of base plates.

9. The alignment device of claim of 1, wherein the material is a display panel.

10. The alignment device of claim of 1, further comprising:
a vision unit disposed on the plurality of base plates.

11. A lamination device comprising:
an alignment device including:
   a first stage;
   a plurality of base plates disposed on the first stage and on which a first material is placed; and
   a plurality of second stages disposed under the first stage, and connected to the plurality of base plates, respectively, wherein each of the plurality of second stages is capable of aligning a base plate, of the plurality of base plates, connected to the each of the plurality of second stages in X, Y, and 0 directions; and
a pressure unit disposed on the alignment device and on which a second material is placed.

12. The lamination device of claim 11, wherein the plurality of base plates includes:
   a first plate disposed on a center of the first stage;
   a second plate disposed on a first side of the first plate; and
   a third plate disposed on a second side of the first plate opposite to the first side.

13. The lamination device of claim 12, wherein the plurality of second stages includes:
   a first alignment stage connected to the first plate;
   a second alignment stage disposed on the first alignment stage, and connected to the second plate; and
   a third alignment stage disposed on the first alignment stage, and connected to the third plate.

14. The lamination device of claim 13, further comprising:
   a first pitch control unit disposed between the first alignment stage and the second alignment stage, and capable of horizontal movement; and
   a second pitch control unit disposed between the first alignment stage and the third alignment stage, and capable of horizontal movement.

15. The lamination device of claim of 12, further comprising:
   a plurality of load distribution units disposed between the first stage and the plurality of base plates,
   wherein each of the plurality of load distribution units includes:
      a guide rail; and
      a cross roller movable along the guide rail.

16. The lamination device of claim of 15, wherein,
   the plurality of load distribution units includes a first load distribution unit and a second load distribution unit,
   the first load distribution unit is disposed under the second plate, and
   the second load distribution unit is disposed under the third plate.

17. The lamination device of claim of 11, wherein each of the plurality of second stages is a UVW stage.

18. The lamination device of claim of 11, further comprising:
   at least one jig disposed on the plurality of base plates.

19. The lamination device of claim of 11, wherein the first material is a display panel.

20. The lamination device of claim of 11, wherein the second material is a cover glass.

* * * * *